(12) United States Patent
Iwamatsu et al.

(10) Patent No.: US 7,961,011 B2
(45) Date of Patent: Jun. 14, 2011

(54) AMPLIFIER

(75) Inventors: Masayuki Iwamatsu, Hamamatsu (JP);
Hirotoshi Tsuchiya, Fukuroi (JP)

(73) Assignee: Yamaha Corporation, Hamamatsu-shi (JP)

( * ) Notice: Subject to any disclaimer, the term of this patent is extended or adjusted under 35 U.S.C. 154(b) by 27 days.

(21) Appl. No.: 12/286,948

(22) Filed: Oct. 3, 2008

(65) Prior Publication Data

US 2009/0091355 A1 Apr. 9, 2009

Related U.S. Application Data

(63) Continuation-in-part of application No. 12/154,944, filed on May 28, 2008, now Pat. No. 7,551,031.

(30) Foreign Application Priority Data

| May 30, 2007 | (JP) | 2007-143177 |
| Oct. 3, 2007 | (JP) | 2007-260049 |
| Oct. 22, 2007 | (JP) | 2007-273452 |

(51) Int. Cl.
*H03K 5/22* (2006.01)
(52) U.S. Cl. .............. 327/65; 327/64; 327/67
(58) Field of Classification Search .............. 327/63–65, 327/67, 77, 87, 89
See application file for complete search history.

(56) References Cited

U.S. PATENT DOCUMENTS

| 5,706,222 A | * | 1/1998 | Bonaccio et al. | 708/841 |
| 6,590,436 B2 | * | 7/2003 | Jordanger et al. | 327/333 |
| 7,560,959 B2 | * | 7/2009 | Paraschou et al. | 327/72 |
| 7,633,320 B2 | * | 12/2009 | Yamamoto et al. | 327/60 |

FOREIGN PATENT DOCUMENTS

| JP | 05-102767 | 4/1993 |
| JP | 10-163769 | 6/1998 |
| JP | A-2000-106511 | 4/2000 |

OTHER PUBLICATIONS

Korean Intellectual Property Office, Notice of Preliminary Rejection for Application No. 10-2008-0050906 (Dated: Jan. 27, 2010; 6 pgs.).
Japanese Patent Office, Notice of Reasons for Refusal for Application No. 2007-143177 (Dispatch Date: Jul. 7, 2009; 3 pgs.).
The State Intellectual Property Office of the People's Republic of China, "Notification of First Office Action" Chinese Patent Application No. 200810161950.7 dated Jan. 27, 2011, 4 pages.

* cited by examiner

*Primary Examiner* — Long Nguyen
(74) *Attorney, Agent, or Firm* — Pillsbury Winthrop Shaw Pittman LLP (57) ABSTRACT

An amplifier includes: an operation amplifier including a positive input terminal and a negative input terminal; and a detector which detects that a difference between a voltage of the positive input terminal and a voltage of the negative input terminal is equal to or exceeds a predetermined value and outputs a detection signal.

15 Claims, 6 Drawing Sheets

AMPLIFIER

CROSS-REFERENCE TO RELATED APPLICATIONS

The present application claims priority from Japanese patent application Nos. 2007-260049 and 2007-273452, filed on Oct. 3, 2007 and Oct. 22, 2007, respectively, and is a continuation in part (CIP) of U.S. patent application Ser. No. 12/154,944 entitled "AMPLIFIER" filed on May 28, 2008, now U.S. Pat. No. 7,551,031, which claims priority from Japanese patent application No. 2007-143177, filed on May 30, 2007, the disclosures of which are incorporated herein in their entirety by reference.

BACKGROUND OF THE INVENTION

The present invention relates to an amplifier, and in particular, an amplifier capable of detecting the occurrence of clipping at a desired degree.

Conventionally, an amplifier is configured to prevent clipping due to excessive input by attenuating an input signal when detecting that an output voltage has exceeded a predetermined voltage value, for example, a power supply voltage value. Since an accurate judgment on whether clipping is actually occurring can not be made by the output voltage detection, a technique of reliably detecting the occurrence of clipping and attenuating an input signal is disclosed in Japanese Published Unexamined Patent Application No. H10-163769.

The aforementioned technique focuses on preventing the occurrence of clipping, and thus is configured to detect clipping and attenuate an input signal as soon as clipping occurs or is likely to occur. However, such control is undesirable in some cases; when applied to an acoustic device, for example, attenuating action is so fast that a feeling of volume is lacking. In such a case, it is preferable that a feeling of volume is given a high priority and a certain degree of clipping is allowed.

SUMMARY OF THE INVENTION

The present invention is made in view of the foregoing circumstances, and accordingly an object of the present invention to be solved is to allow an amplifier to detect the occurrence of clipping at a desired degree.

In order to solve the aforementioned problem, an amplifier according to the present invention includes:

an operation amplifier including a positive input terminal and a negative input terminal;

a detector which detects that a difference between a voltage of the positive input terminal and a voltage of the negative input terminal is equal to or exceeds a predetermined value and outputs a detection signal.

When clipping occurs in the amplifier, a voltage difference between the positive input terminal and the negative input terminal of the operation amplifier is produced according to a degree of the clipping. Comparing the voltage difference with a predetermined value allows clipping at a desired degree to be detected.

In such a case, the predetermined value is set in accordance with a degree of clipping that occurs in an output signal of the amplifier, and the detection signal indicates that clipping at a preset degree has occurred. Distortion of the output signal due to clipping and a feeling of volume are in a trade-off relationship. Thus, balancing the both is rendered possible by setting the predetermined value as appropriate.

Preferably, as a specific configuration, a first circuit (for example, an analog circuit 30b in the embodiment) is formed in a first path extending from a positive output terminal to the negative input terminal of the operation amplifier, a second circuit (for example, an analog circuit 30a in the embodiment) is formed in a second path extending from a negative output terminal to the positive input terminal of the operation amplifier, an output signal of the first circuit is taken out as a positive output signal of the amplifier and an output signal of the second circuit is taken out as a negative output signal of the amplifier. The first and the second path serve as a negative feedback path. When clipping occurs in the positive output signal and the negative output signal, a virtual short in the operation amplifier is broken. This leads to a discrepancy between the voltage of the positive input terminal and the voltage of the negative input terminal of the operation amplifier, thereupon causing a voltage difference. The larger the degree of clipping, the greater the voltage difference becomes. The detector compares the voltage difference with a predetermined value, so that a degree of clipping can be detected.

Here, each of the first and second circuits is preferably a level shift circuit which shifts signal levels.

Further, in order to solve the aforementioned problem, an amplifier includes:

an operation amplifier including a positive input terminal and a negative input terminal; and a detector which compares at least one of a voltage of a positive input terminal and a voltage of a negative input terminal of the operation amplifier with a predetermined voltage, detects that the at leas one of the voltage exceeded the predetermined voltage, and outputs a detection signal.

When clipping occurs in the amplifier, a voltage according to the degree of clipping is produced in the positive input terminal and the negative input terminal. Comparing this voltage with a predetermined voltage allows clipping at the desired degree to be detected.

In such a case, the predetermined voltage is set in accordance with the degree of clipping that occurs in an output signal of the amplifier, and the detection signal indicates that clipping at a preset degree has occurred. Distortion of the output signal due to clipping and a feeling of volume are in a trade-off relationship. Thus, balancing the both is rendered possible by setting the predetermined voltage as appropriate.

Preferably, as a specific configuration, a first circuit (for example, an analog circuit 30a in the embodiment) is formed in a first path extending from a negative output terminal to the positive input terminal of the operation amplifier, a second circuit (for example, an analog circuit 30b in the embodiment) is formed in a second path extending from a positive output terminal to the negative input terminal of the operation amplifier, an output signal of the first circuit is taken out as a negative output signal of the amplifier and an output signal of the second circuit is taken out as a positive output signal of the amplifier. The first and second paths serve as a negative feedback path. When clipping occurs in the positive output signal and the negative output signal, a virtual short in the operation amplifier is broken. This changes the voltage of the positive input terminal of the operation amplifier and the voltage of the negative input terminal of the operation amplifier according to the degree of clipping. The detecting means compares at least one of the voltage of the positive input terminal of the operation amplifier and the voltage of the negative input terminal of the operation amplifier with the predetermined voltage, so that the degree of clipping can be detected.

Here, each of the first and second circuits is preferably a level shift circuit which shifts signal levels.

DETAILED DESCRIPTION OF PREFERRED EMBODIMENTS

First Embodiment

Figure 1:
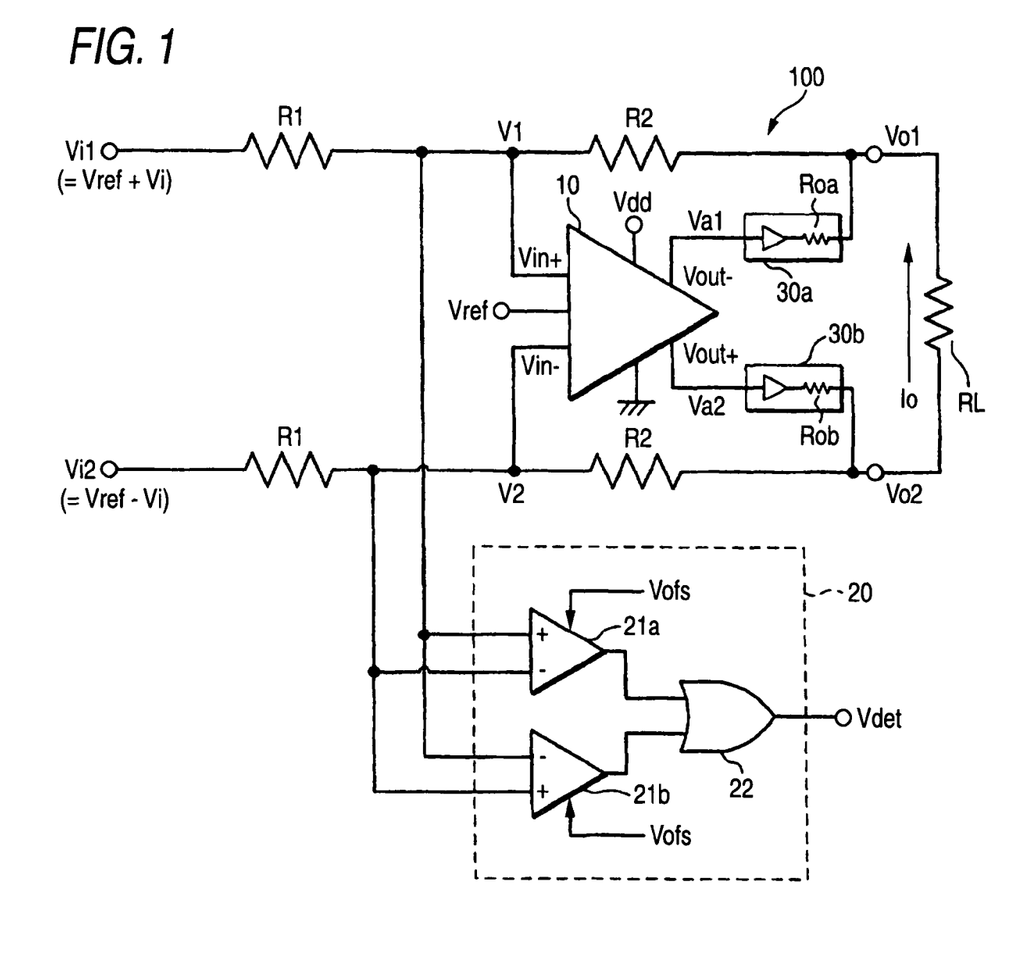
FIG. 1 is a circuit configuration diagram showing a configuration of an amplifier according to a first embodiment of the present invention.

A first embodiment of the present invention is described with reference to the drawings. FIG. 1 is a circuit diagram showing a configuration of an amplifier 100 of the first embodiment. As shown in FIG. 1, the amplifier 100 includes a differential output operation amplifier 10. The amplifier 100 also includes positive and negative input signal terminals and negative and positive output signal terminals. The amplifier 100 inputs a positive input signal Vi1 and a negative input signal Vi2 and outputs a negative output signal Vo1 and a positive output signal Vo2.

The differential output operation amplifier 10 includes a reference voltage terminal. The differential output operation amplifier 10 outputs a first output signal Va1 (negative) and a second output signal Va2 (positive) taking a voltage supplied to the reference voltage terminal as the amplitude center. Since a reference voltage Vref is supplied to the reference voltage terminal in this example, the second output signal Va2 output from the positive output terminal Vout+ and the first output signal Va1 output from the negative output terminal Vout− swing up and down around the reference voltage Vref. When a voltage difference between the positive input signal Vi1 and the negative input signal Vi2 is 0, both of the first output signal Va1 and the second output signal Va2 have the same voltage as the reference voltage Vref. The relationship between a power supply voltage Vdd and the reference voltage Vref in this example becomes Vref=Vdd/2.

Although an amplitude center voltage of the positive input signal Vi1 and the negative input signal Vi2 and a voltage supplied to the reference voltage terminal can be set individually, the amplitude center voltage of the positive input signal Vi1 and the negative input signal Vi2 is taken as the reference voltage Vref in this embodiment. Thus, if an alternating current input signal voltage is Vi, the positive input signal Vi1 becomes Vref+Vi, and the negative input signal Vi2 becomes Vref−Vi.

Resistances R1 are connected between the positive and the negative input signal terminal of the amplifier 100 and the positive and negative input terminals Vin+ and Vin− of the differential output operation amplifier 10, respectively, while resistances R2 are connected between the negative and positive output signal terminals of the amplifier 100 and the positive and negative input terminals Vin+ and Vout+ of the differential output operation amplifier 10, respectively. Further, analog circuits 30a and 30b are connected between the negative and positive output terminals Vout− and Vout+ of the differential output operation amplifier 10 and the negative and positive output signal terminals of the amplifier 100, respectively. The differential output operation amplifier 10 is supplied with Vdd as a power supply voltage at the positive side and grounded at the negative side. Therefore, an output voltage of the differential output operation amplifier 10 takes on values from 0V to Vdd, and is to be clipped at 0V or Vdd depending on values of the positive input signal Vi1 and the negative input signal Vi2.

In addition, the positive and negative input terminals Vin+ and Vin− of the differential output operation amplifier 10 are connected with a comparator circuit 20 comparing magnitude between respective voltages V1 and V2 and outputting a comparison result. The comparator circuit 20 includes offset-setting-function-equipped comparators 21a and 21b and an OR circuit 22 which operates a logical sum of respective output signals of the comparators 21a and 21b. The offset-setting-function-equipped comparator 21a outputs a true signal (high level) when the voltage V1 of the positive input terminal Vin+ of the differential output operation amplifier 10 becomes an offset voltage Vofs or more than the voltage V2 of the negative input terminal Vin− of the differential output operation amplifier 10. The offset-setting-function-equipped comparator 21b outputs a true signal (high level) when the voltage V2 of the negative input terminal Vin− of the differential output operation amplifier 10 becomes the offset voltage Vofs or more than the voltage V1 of the positive input terminal Vin+ of the differential output operation amplifier 10. As a result, the comparator circuit 20 outputs a detection signal Vdet being true (high level) when a difference between the voltage V1 of the positive input terminal Vin+ and the voltage V2 of the negative input terminal Vin− of the differential output operation amplifier 10 has equaled or exceeded the offset voltage Vofs. The offset voltage Vofs shall be able to be set at a given value externally.

When the amplifier 100 is during normal operation, that is, clipping is not occurring in the positive output signal Vo2 or the negative output signal Vo1, a virtual short is formed between the voltage V1 of the positive input terminal Vin+ and the voltage V2 of the negative input terminal Vin− of the differential output operation amplifier 10. Accordingly Vi becomes equal to V2, and the detection signal Vdet becomes false (low level). When an output of the amplifier 100 is clipped, however, a virtual short does not come to be formed. Thus, the relationship of V1=V2 cannot be held and a voltage difference is produced. When the extent of the voltage difference has equaled or exceeded the offset voltage Vofs, the detection signal Vdet of the comparator circuit 20 becomes true. More specifically, the comparator circuit 20 serves as a means for detecting that a difference between the voltage V1 of the positive input terminal Vin+ and the voltage V2 of the negative input terminal Vin− of the operation amplifier have equaled or exceeded a preset offset voltage Vofs (a predetermined value) and outputs a detection signal Vdet.

On the other hand, the comparator circuit 20 uses two comparators in FIG. 1. However, either one of them may be used. In such a case, the OR circuit 22 becomes unnecessary. When two comparators are used, a comparison between V1 and V2 is made in units of a half cycle of the positive input signal Vi1 and the negative input signal Vi2. When one comparator is used, a comparison between V1 and V2 is made in units of one cycle of the positive input signal Vi1 and the negative input signal Vi2.

First, a case where the analog circuits 30a and 30b do not perform level shifting will be described. In such a case, an output voltage of the amplifier 100 swings around the reference voltage Vref and takes on values from 0V to Vdd. When clipping occurs, 0V or Vdd is output. Further, it is assumed that a gain of the analog circuits 30a and 30b is 1.

Figure 2A:
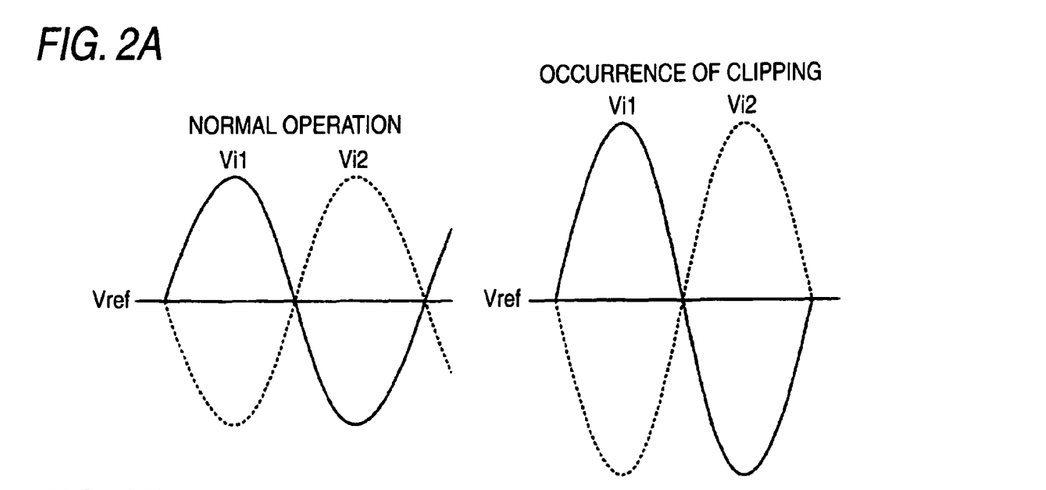
FIGS. 2A to 2C are diagrams showing voltage waveforms during normal operation and occurrence of clipping when level shifting is not conducted.
Figure 2B:
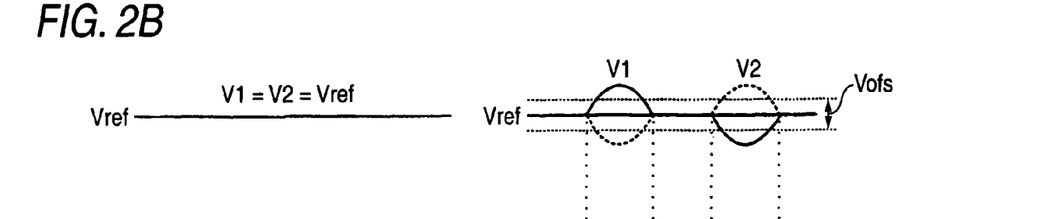
Figure 2C:
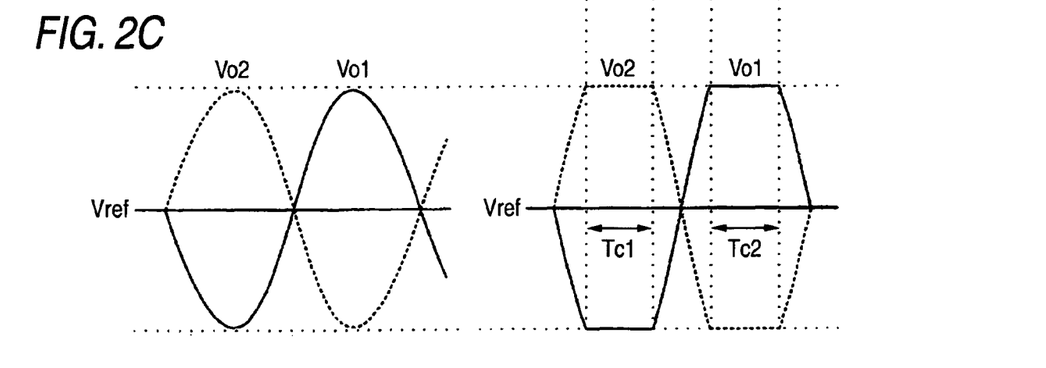

FIGS. 2A to 2C are diagrams showing voltage waveforms during normal operation and the occurrence of clipping. FIG. 2A shows a positive input signal Vi1 of the amplifier 100 by a solid line and a negative input signal Vi2 of the amplifier 100 by a broken line. FIG. 2B shows a voltage V1 of the positive input terminal Vin+ of the differential output operation amplifier 10 by a solid line and a voltage V2 of the negative input terminal Vin− of the differential output operation amplifier 10 by a broken line. FIG. 2C shows a voltage Vo1 of the negative output signal terminal of the amplifier 100 by a solid line and a voltage V02 of the positive output signal terminal of the amplifier 100 by a broken line. A part where the solid line and the broken line overlap each other is shown by a solid line.

During normal operation, the gain of the amplifier 100 is −R2/R1, and an output voltage swings up and down around the reference voltage Vref. Thus, the negative output signal Vo1 takes on the following:

$$Vo1 = Vref - \frac{R2}{R1}Vi \qquad \text{Formula 1}$$

Further, the positive input signal Vi1 takes on the following:

$$Vi1 = Vref + Vi \qquad \text{Formula 2}$$

Additionally, a current does not flow into the positive input terminal Vin+ of the differential output operation amplifier 10. Thus, the voltage V1 becomes a value obtained by dividing the voltage Vo1 and the voltage Vi1 by the resistance R1 and the resistance R2, and the following equation holds:

$$(Vo1 - Vi1)\frac{R1}{R1 + R2} + Vi1 = V1 \qquad \text{Formula 3}$$

Accordingly, the following is obtained:

$$V1 = Vref \qquad \text{Formula 4}$$

Further, the following is obtained for V2 in the same manner:

$$V2 = Vref \qquad \text{Formula 5}$$

Thus, as shown in FIG. 2B, the following holds and the solid line and the broken line overlap each other during normal operation:

$$V1 = V2 = Vref \qquad \text{Formula 6}$$

On the other hand, when an amplitude of the positive input signal Vi1 and the negative input signal Vi2 is increased as shown in FIG. 2A, clipping occurs in the negative output signal Vo1 and the positive output signal Vo2 during a time period TC1 and a time period TC2, and a waveform of the output signals is formed into a shape that is cut by Vdd and 0V. During the occurrence of clipping, the negative output signal Vo1 becomes 0 or Vdd in Formula 3, so that a virtual short does not come to be formed during the time period TC1 and the time period TC2 and a mountain shaped waveform around the reference voltage Vref appears in the voltage V1, as shown in FIG. 2B. This waveform appears symmetrically in the voltage V1 and the voltage V2. That is, a voltage difference between the voltages V1 and V2 is produced. The voltage difference between the voltages V1 and V2 is related to magnitude of the positive input, signal Vi1 and the negative input signal Vi2 as derived from Formula 3. The greater the amplitude of those input signals, the larger the degree of clipping becomes. Thus, the voltage difference between the voltages V1 and V2 indicates the degree of clipping.

The comparator circuit 20 is a circuit which detects that a difference between the voltages V1 and V2 of the positive and negative input terminals of the differential output operation amplifier 10 has equaled or exceeded the offset voltage Vofs. Thus, controlling magnitude of the offset voltage Vofs allows for detection that clipping at a given degree has occurred. When the offset voltage Vofs is set to a voltage slightly larger than 0, for example, the occurrence of clipping can be detected promptly even if only a little. On the other hand, the degree of clipping to be detected can be rendered larger as the offset voltage Vofs is increased.

Subsequently, a case where the analog circuits 30a and 30b are a level shift circuit which performs a shift of signal levels is described. In this embodiment, both of the analog circuits 30a and 30b perform level shifting by −Vref. Further, the analog circuits 30a and 30b shall be supplied with Vdd as a power supply voltage at the positive side and grounded at the negative side in the same manner as the differential output operation amplifier 10. Thus, an output voltage of the analog circuits 30a and 30b takes on values from 0V to Vdd, and comes to be clipped at 0V or Vdd depending on values of the positive input signal Vi1 and the negative input signal Vi2.

In such a case, an output of the analog circuits 30a and 30b takes on values from 0V to Vdd, so that a portion not more than 0V is cut. When clipping occurs in the positive direction, Vdd is output.

Figure 3A:
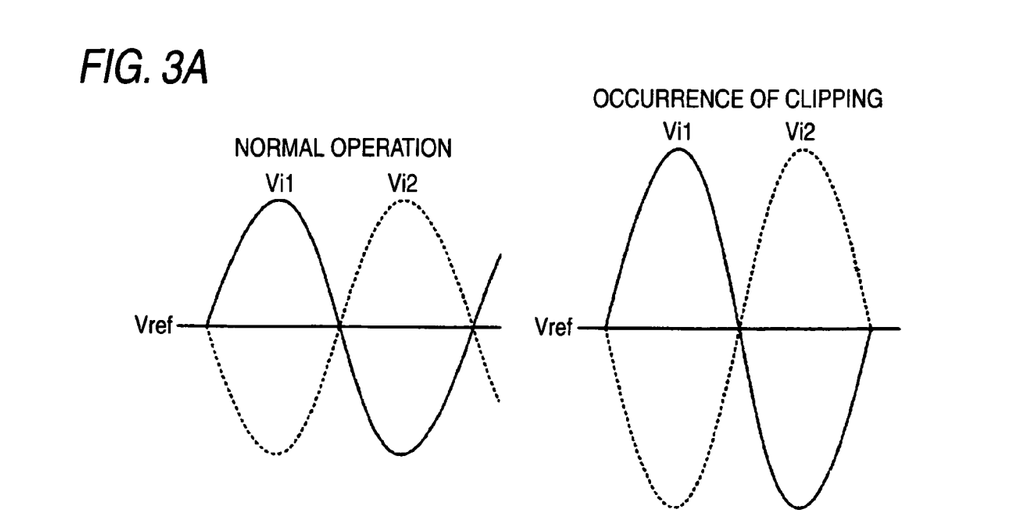
FIGS. 3A to 3C are diagrams showing voltage waveforms during normal operation and occurrence of clipping when level shifting is conducted.
Figure 3B:
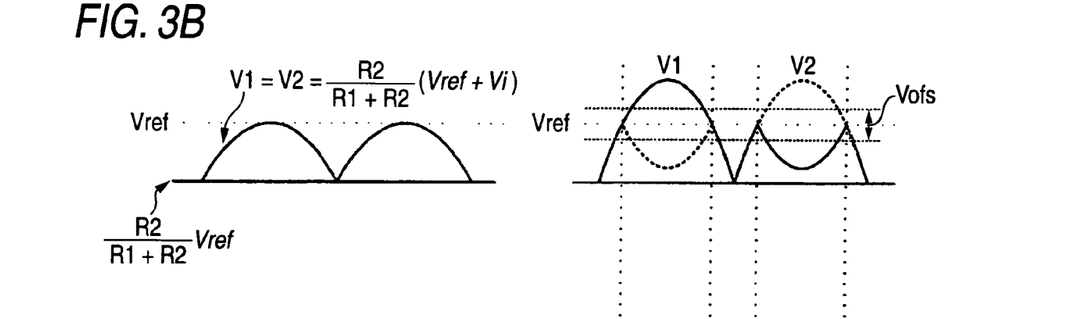
Figure 3C:
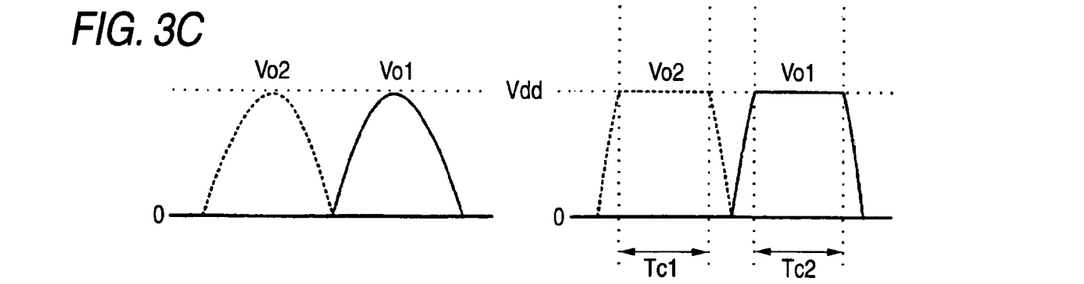

FIGS. 3A to 3C are diagram showing voltage waveforms during normal operation and the occurrence of clipping. FIG. 3A shows a positive input signal Vi1 of the amplifier 100 by a solid line and a negative input signal Vi2 of the amplifier 100 by a broken line. FIG. 3B shows a voltage V1 of the positive input terminal Vin+ of the differential output operation amplifier 10 by a solid line and a voltage V2 of the negative input terminal Vin− of the differential output operation amplifier 10 by a broken line. FIG. 3C shows a negative output signal Vo1 of the amplifier 100 by a solid line and a positive output signal Vo2 of the amplifier 100 by a broken line. A part where the solid line and the broken line overlap each other is shown by the solid line.

The positive input signal Vi1 is the following during normal operation:

$$Vi1 = Vref + Vi \qquad \text{Formula 7}$$

The voltage V1 becomes a value obtained by dividing the voltage Vo1 and the voltage Vi1 by the resistance R1 and the resistance R2, and the following equation holds:

$$(Vo1 - Vi1)\frac{R1}{R1 + R2} + Vi1 = V1 \qquad \text{Formula 8}$$

Since a portion not more than 0V is cut by the analog circuit 30a, Vo1 becomes 0V during a time period when Vi1 is positive (a first half part of the cycle). On the other hand, Vo2 becomes 0V during the latter half part of the cycle in which Vi2 is positive. From the above, the following is obtained:

$$V1 = \frac{R2}{R1 + R2}(Vref + Vi) \qquad \text{Formula 9}$$

V2 is figured in the same manner. Since a virtual short is formed, the following equation holds, and the solid line and the broken line overlap each other and a two mountain shaped waveform appears as shown in FIG. 3B:

$$V1 = V2 = \frac{R2}{R1+R2}(Vref + Vi) \qquad \text{Formula 10}$$

On the other hand, when an amplitude of the positive input signal Vi1 and the negative input signal Vi2 is increased as shown in FIG. 3A, clipping occurs in the negative output signal Vo1 and the positive output signal Vo2 during the time periods TC1 and TC2 as shown in FIG. 3C. A waveform of the output voltage signals is formed into a shape that is cut by Vdd and 0V.

First, attention is given to the voltage V1. When clipping occurs in the negative output signal Vo1 during the time period TC2 which is the latter half of one cycle, the voltage V1 takes on a waveform whose mountain shape is folded down around the reference voltage Vref as shown in FIG. 3B, since the negative output signal Vo1 becomes a constant value of Vdd in Formula 8. However, clipping does not occur in the negative output signal Vo1 during the first half of one cycle, and thus a mountain shaped waveform appears.

On the other hand, as for the voltage V2, clipping occurs in the positive output signal Vo2 during the time period TC1 that is the first half of one cycle, so that a waveform whose mountain shape is folded down appears in the first half of one cycle and a mountain shaped waveform appears in the latter half of one cycle. When clipping occurs, a virtual short does not come to be formed between the voltages V1 and V2. Accordingly, a voltage difference is produced between the voltages V1 and V2. Since determined in accordance with the magnitude of the positive input signal Vi1 and the negative input signal Vi2 as derived from Formula 8, this voltage difference indicates the degree of clipping.

The comparator circuit 20 is a circuit which detects that a difference between the voltages V1 and V2 of the differential output operation amplifier 10 has equaled or exceeded the offset voltage Vofs. Thus, controlling the magnitude of the offset voltage Vofs allows for detection that clipping at a given degree has occurred. When the offset voltage Vofs is set to a voltage slightly larger than 0, for example, the occurrence of clipping can be detected promptly even if only a little. On the other hand, the degree of clipping to be detected can be rendered larger as the offset voltage Vofs is increased.

Further, there is the following advantage in an actual circuit for the method of detecting the degree of clipping based on a voltage difference between the voltages V1 and V2.

An output element of the analog circuits 30a and 30b is composed of a transistor in the amplifier 100 shown in FIG. 1. There equivalently exist output resistances Roa and Rob in the transistor.

Herein, suppose a case where the negative output signal Vo1 is in negative polarity with reference to the amplitude center and the positive output signal Vo2 is in positive polarity with reference to the amplitude center.

First, the following equations hold during normal operation:

$$\frac{V1-Vo1}{R2} = \frac{Vi1-V1}{R1} \qquad \text{Formula 11}$$

$$\frac{Vo2-V2}{R2} = \frac{V2-Vi2}{R1}$$

From the above equations, the following is obtained:

$$Vo2 - Vo1 = 2\frac{R2}{R1}Vi - \frac{(R1+R2)}{R1}(V1-V2) \qquad \text{Formula 12}$$

During normal operation, a virtual short is formed and V1=V2 holds. Thus, the following is obtained:

$$Vo2 - Vo1 = 2\frac{R2}{R1}Vi \qquad \text{Formula 13}$$

$$V1 = \frac{R2}{R1+R2}Vref + \frac{1}{2}\frac{R1}{R1+R2}(Vo2-Vo1)$$

Now, a current Io that flows during clipping and a drop in voltage due to the output resistances Roa and Rob are considered. The upper limit of the negative output signal Vo1 becomes Vo1=Vdd−RoaIo, but not Vdd. The lower limit becomes Vo1=RoaIo. In the same manner for the positive output signal Vo2, the upper limit becomes Vo2=Vdd−RobIo, and the lower limit becomes Vo2=RobIo. Those are substituted into Formula 13 to obtain clipped voltages V1 and V2.

$$V1 = V2 = Vref + \frac{1}{2}\frac{R1}{R1+R2}(Roa-Rob)Io \qquad \text{Formula 14}$$

where Vref=Vdd/2

As obvious from Formula 14, the voltages V1 and V2 during clipping are fixed at Vref=Vdd/2 when the output resistances Roa and Rob of the analog circuits 30a and 30b are equal.

However, the output resistances Roa and Rob of the analog circuits 30a and 30b are often unequal in the actual circuit due to manufacturing variations, etc. The voltages V1 and V2 during clipping do not become the reference voltage Vref when the output resistances Roa and Rob of the analog circuits 30a and 30b are different from each other. Thus, an error occurs during clipping detection by an absolute value of either one of the voltage V1 or the voltage V2, for example. Similarly, an error occurs during clipping detection by an absolute value of either one of the voltage V1 or the voltage V2 when a value of load resistance RL is changed, since the output current Io during clipping changes and accordingly the voltages V1 and V2 during clipping do not become the reference voltage Vref.

In the present method, on the contrary, clipping detection is performed based on a voltage difference between the voltages V1 and V2. Consequently, the aforementioned error due to a difference in output resistances Roa and Rob of the analog circuits 30a and 30b and error due to a change in output current Io during clipping when a value of load resistance RL is changed are canceled, whereupon clipping detection with high precision becomes possible.

On the other hand, the analog circuits 30a and 30b in the embodiment described above may add a gain or may include a function of pulse duration modulation or class D amplifier. In such a case, a low-pass filter composed of a resistance, a capacitor, etc., may be used instead of the resistance R2 formed in the feedback path.

Second Embodiment

Figure 4:
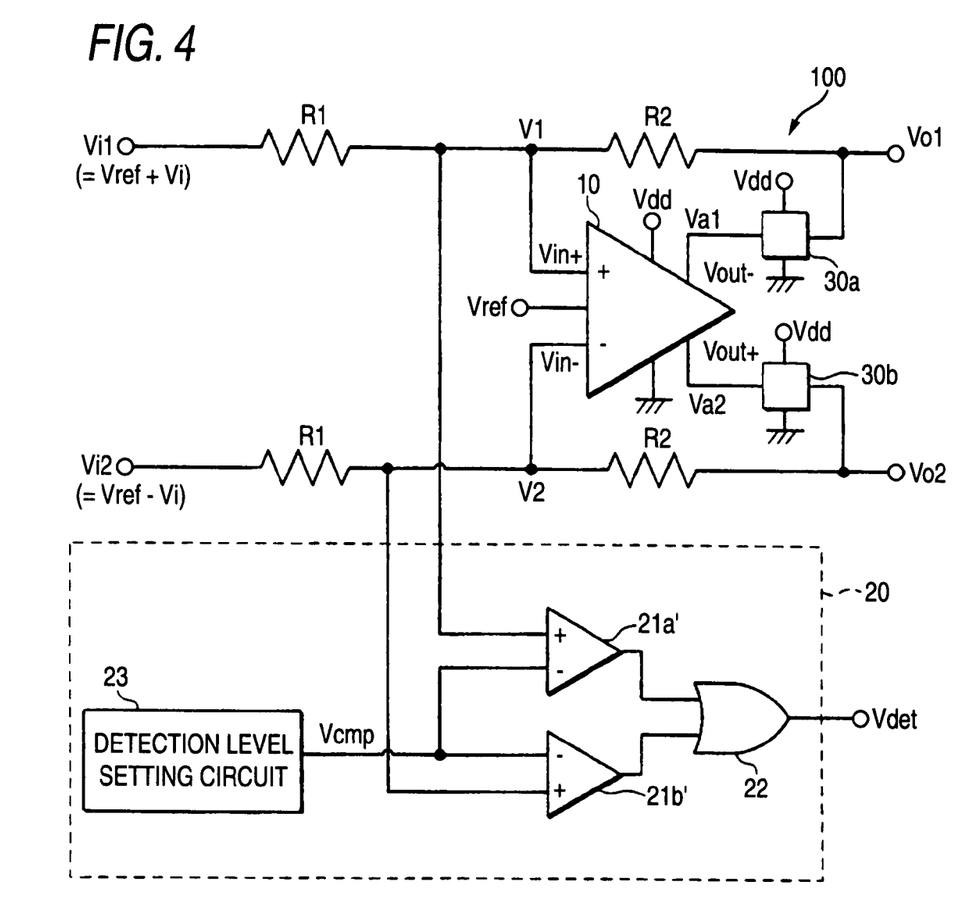
FIG. 4 is a circuit configuration diagram showing a configuration of an amplifier according to a second embodiment of the present invention.

A second embodiment according to the present invention will be described below. In the second embodiment of the invention, those portions similar to the corresponding portions of the first embodiment will be designated by identical reference numerals, respectively, and explanation thereof will be omitted. FIG. 4 is a circuit configuration diagram showing a configuration of an amplifier according to a second embodiment of the present embodiment.

According to the second embodiment, the comparator circuit 20 is provided with comparators 21a' and 21b', an OR circuit 22 which operates a logical sum of output signals of respective comparators, and a detection level setting circuit 23 which outputs a voltage for comparison. The comparator 21a' outputs a true signal (high level) when the voltage V1 of the positive input terminal Vin+ of the differential output operation amplifier 10 has exceeded a voltage for comparison Vcmp output by the detection level setting circuit 23. The comparator 21b' outputs a true signal (high level) when the voltage V2 of the negative input terminal Vin− of the differential output operation amplifier 10 has exceeded the voltage for comparison Vcmp output by the detection level setting circuit 23. As a result, the comparator circuit 20 outputs a detection signal Vdet that becomes true (high level) when either the voltage V1 of the positive input terminal Vin+ or the voltage V2 of the negative input terminal Vin− of the differential output operation amplifier 10 has exceeded the voltage for comparison Vcmp output by the detection level setting circuit 23. The voltage for comparison Vcmp output by the detection level setting circuit 23 can be set at a given value externally.

On the other hand, the comparator circuit 20 uses two comparators in FIG. 4. However, either one of them may be used. In such a case, the OR circuit 22 becomes unnecessary. When two comparators are used, a comparison between the voltages V1 and V2 and the voltage for comparison Vcmp is made, whereas when one comparator is used, a comparison between the voltage V1 or V2 and the voltage for comparison Vcmp is made.

In the present embodiment, the analog circuits 30a and 30b are a level shift circuit which performs a shift of signal levels. Herein, both of the analog circuits 30a and 30b shall perform level shifting by −Vref. Further, the analog circuits 30a and 30b shall be supplied with Vdd as a power supply voltage at the positive side and grounded at the negative side in the same manner with the differential output operation amplifier. Thus, an output voltage of the analog circuits 30a and 30b takes on values from 0V to Vdd, and comes to be clipped at 0V or Vdd depending on values of the positive input signal Vi1 and the negative input signal Vi2.

In such a case, an output voltage of the amplifier 100 swings around 0V since level shifting by −Vref is performed in the analog circuits 30a and 30b. However, an output of the analog circuits 30a and 30b takes on values from 0V to Vdd. Accordingly, the positive output signal Vo1 and the negative output signal Vo2 are clipped at 0V in the negative direction and at Vdd in the positive direction.

Figure 5A:
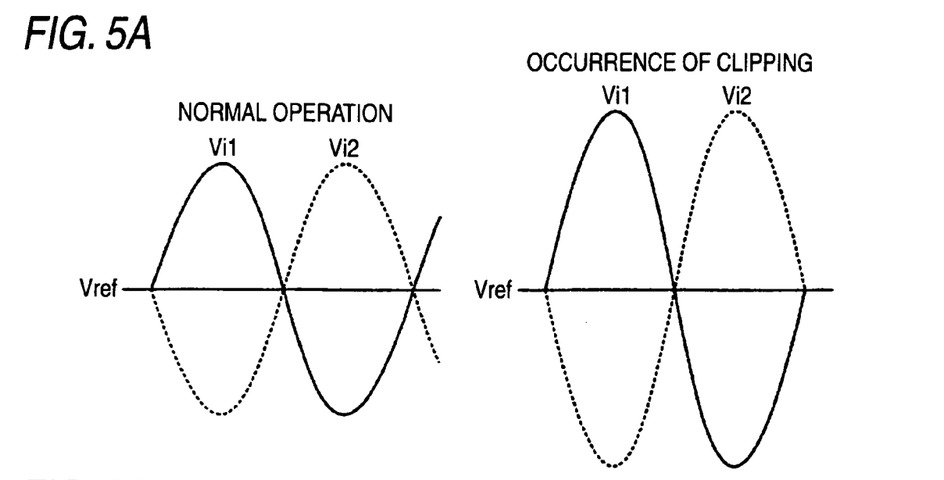
FIGS. 5A to 5C are diagrams showing voltage waveforms during normal operation and the occurrence of clipping.
Figure 5B:
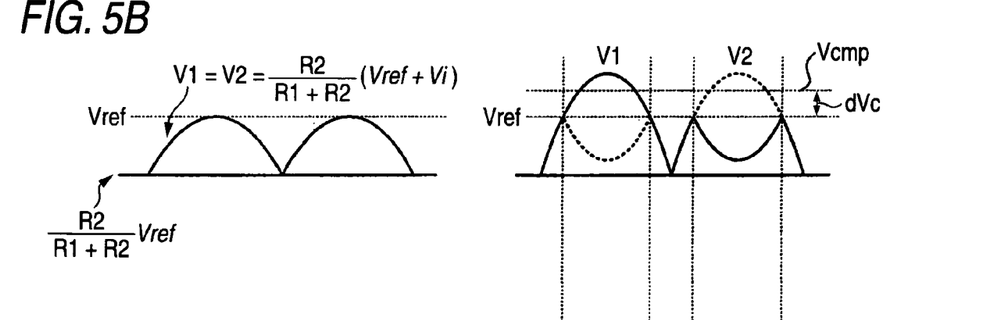
Figure 5C:
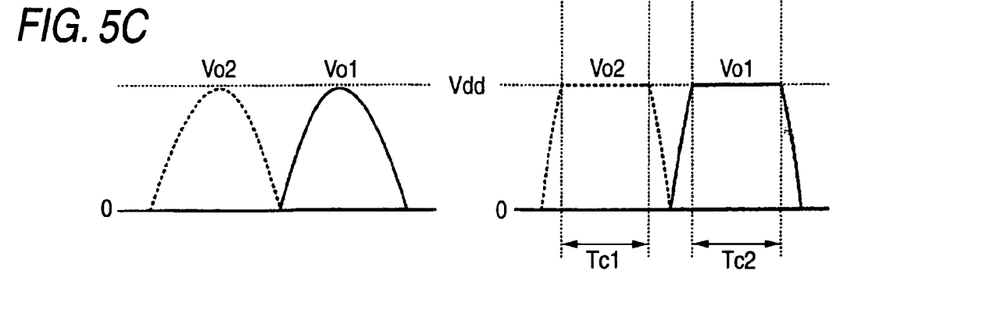

FIGS. 5A to 5C are diagrams showing voltage waveforms during normal operation and occurrence of clipping. FIG. 5A shows an input voltage Vi1 of the positive input terminal of the amplifier 100 by a solid line and an input voltage Vi2 of the negative input signal terminal of the amplifier 100 by a broken line. FIG. 5B shows a voltage V1 of the positive input terminal Vin+ of the differential output operation amplifier 10 by a solid line and a voltage V2 of the negative input terminal Vin− of the differential output of operation amplifier 10 by a broken line. FIG. 5C shows a voltage Vo1 of the negative output signal terminal of the amplifier 100 by a solid line and a voltage V02 of the positive output signal terminal of the amplifier 100 by a broken line. A part where the solid line and the broken line overlap each other is shown by a solid line.

During normal operation, the positive input signal Vi1 is as follows:

$$Vi1 = Vref + Vi \quad \text{Formula 15}$$

The voltage V1 becomes a value obtained by dividing the voltage Vo1 and the voltage Vi1 by the resistance R1 and the resistance R2.

$$(Vo1 - Vi1) = \frac{R1}{R1 + R2} + Vi1 = V1 \quad \text{Formula 16}$$

A portion not more than 0V of the negative output signal Vo1 is cut by the analog circuit 30a, so that the negative output signal Vo1 becomes 0V when the positive input signal Vi1 is in a positive time period (a first half part of a cycle). On the other hand, Vo2 becomes 0V during the latter half part of the cycle in which Vi2 is positive. Accordingly, the following equation is obtained:

$$V1 = \frac{R2}{R1 + R2}(Vref + Vi) \quad \text{Formula 17}$$

The voltage V2 is figured in the same manner. Since a virtual short is formed, the following holds, and the solid line and the broken line overlap each other and a two mountain shaped waveform appears as shown in FIG. 5B:

$$V1 = V2 = \frac{R2}{R1 + R2}(Vref + Vi) \quad \text{Formula 18}$$

On the other hand, clipping occurs in the positive output signal Vo2 and the negative output signal Vo1 during the time periods TC1 and TC2 as shown in FIG. 5C when amplitudes of the positive input signal Vi1 and the negative input signal Vi2 are increased as shown in FIG. 5A. Waveforms of the output voltage signals are formed into a shape that is cut by Vdd and 0V.

First, attention is given to the voltage V1. When clipping occurs in the negative output signal Vo1 during the time period TC2 that is the latter half of one cycle, the voltage V1 comes to have a waveform whose mountain shape is folded down around the reference voltage Vref as shown in FIG. 5B since the negative output signal Vo1 becomes a constant value of Vdd in Formula 16. However, clipping does not occur in the negative output signal Vo1 in the first half of one cycle, so that a mountain shaped waveform appears.

On the other hand, as for the voltage V2, a waveform whose mountain shape is folded down appears in the first half of one cycle and a mountain shaped waveform appears in the latter half of one cycle since clipping occurs in the positive output signal Vo2 during the time period TC1 that is the first half of one cycle. When clipping occurs, a virtual short does not come to be formed between the voltages V1 and V2, so that either one of the voltage V1 or the voltage V2 becomes a value exceeding the reference voltage Vref. A voltage value exceeding the reference voltage Vref is determined in accordance with the magnitude of the positive input signal Vi1 and the negative input signal Vi2 as derived from Formula 16, and accordingly the voltage value indicates the degree of clipping.

The comparator circuit 20 is a circuit which detects that either of the voltages V1 and V2 of the positive and negative input terminals of the differential output operation amplifier 10 has exceeded a voltage for comparison Vcmp. Thus, controlling the voltage for comparison Vcmp so as to be a value equaling or exceeding the reference voltage Vref allows for the occurrence of clipping at a given degree to be detected. Suppose that a difference between the voltage for comparison Vcmp and the reference voltage Vref is dVc. When dVc is rendered 0, for example, the occurrence of clipping can be detected promptly even if a little. On the other hand, the degree of clipping to be detected can be rendered larger as dVc is increased.

More specifically, according to the aforementioned amplifier 100, setting the voltage for comparison Vcmp at or below the voltages V1 and V2 in which clipping occurs allows for the occurrence of clipping to be detected at the pre-stage of actual occurrence. Consequently, a given output voltage before clipping can be detected, thereupon rendering the amplifier usable in various applications for output limitations. In addition, rendering an output low in distortion factor is possible.

On the other hand, the analog circuits 30a and 30b in the aforementioned embodiment may add a gain or may include a function of pulse duration modulation or class D amplifier. In such a case, a low-pass filter composed of a resistance, a capacitor, etc. may be used instead of the resistance R2 formed in the feedback path.

Third Embodiment

Figure 6:
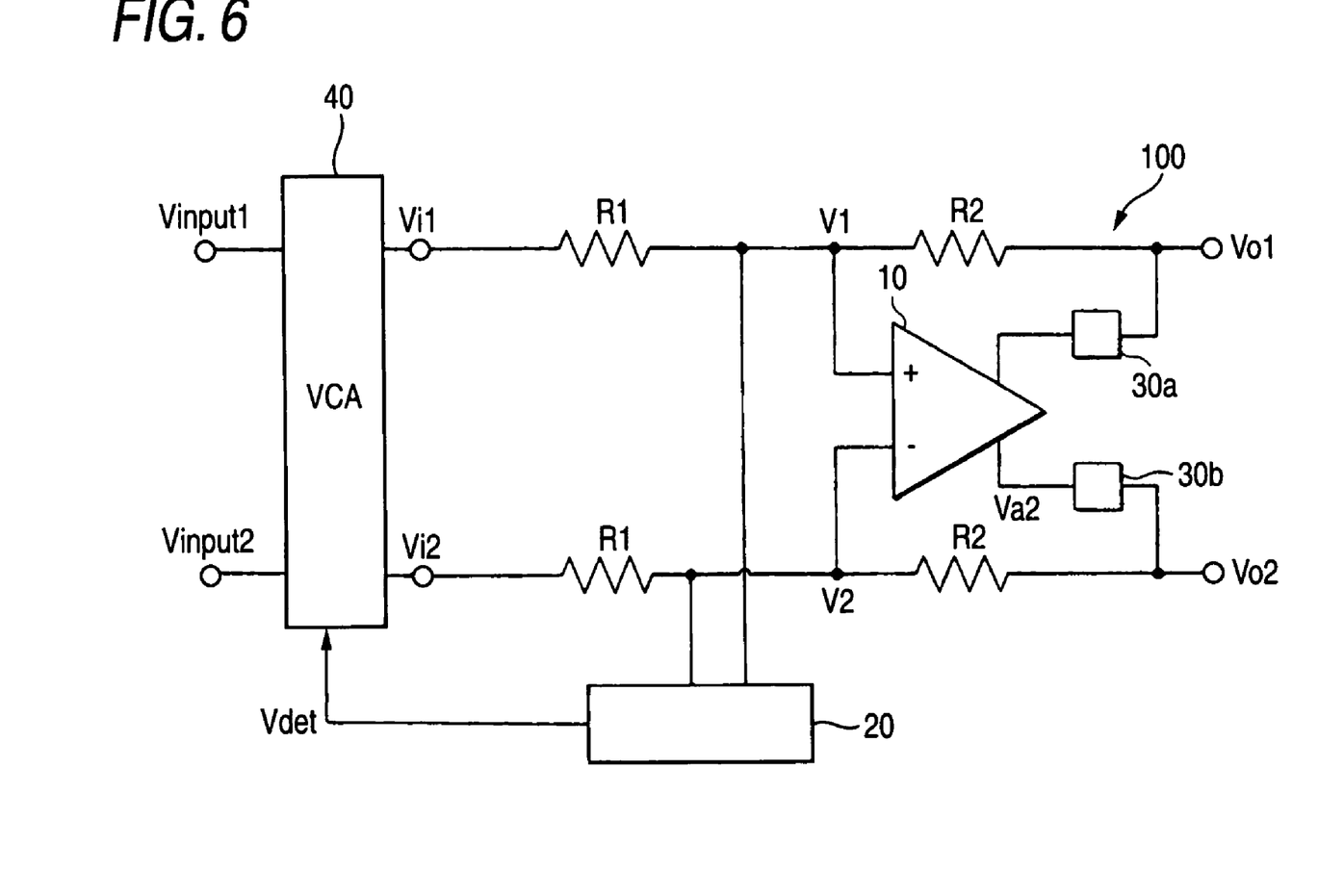
FIG. 6 is a circuit configuration diagram showing a configuration of an amplifier according a third embodiment of the present invention.

A third embodiment according to the present invention will be described with reference to FIG. 6. In the third embodiment of the invention, those portions similar to the corresponding portions of the first and second embodiment will be designated by identical reference numerals, respectively, and explanation thereof will be omitted. Specifically, an amplifier 100 and a comparator circuit 20 according to the third embodiment may employ any of those according to the first or second embodiment. FIG. 6 is a circuit configuration diagram showing a configuration of an amplifier according to the third embodiment of the present embodiment.

According to the third embodiment, a voltage controlled attenuator (VCA) 40 (input level controller) for attenuating input signals Vinput1 and Vinput2 is provided as a previous stage of the amplifier 100. The detection signal Vdet output from the comparator circuit 20 is input to the VCA 40 to control the VCA 40. For example, when the detection signal Vdet being true (high level) is input to the VCA 40, the VCA 40 attenuates the input signals Vinput1 and Vinput2 so as to prevent or suppress the clipping occurring in the output signal of the amplifier 100.

As described in the first and second embodiments, the comparator circuit 20 can set the degree of the clipping to be detected. Thus, the comparator circuit 20 can control the degree of the clipping by controlling the attenuation level of the input signals Vinput1 and Vinput2 by the VCA 40.

What is claimed is:
1. An amplifier comprising:
an operation amplifier including a positive input terminal, a negative input terminal, a positive output terminal and a negative output terminal;
at least one negative feedback circuit disposed in a path extending from one of the output terminals of the operation amplifier to the one of the input terminals of the operation amplifier having the opposite polarity; and
a detector which detects that a difference between a voltage of the positive input terminal and a voltage of the negative input terminal is equal to or exceeds a predetermined value and outputs a detection signal.

2. The amplifier according to claim 1, wherein the predetermined value is set in accordance with a degree of clipping that occurs in an output signal of the amplifier, and the detection signal indicates that clipping at the set degree occurs.

3. The amplifier according to claim 1, wherein
the at least one negative feedback circuit includes:
a first circuit which is formed in a first path extending from a positive output terminal of the operation amplifier to the negative input terminal of the operation amplifier, and
a second circuit which is formed in a second path extending from a negative output terminal of the operation amplifier to the positive input terminal of the operation amplifier, and wherein
an output signal of the first circuit is taken out as a positive output signal of the amplifier, and an output signal of the second circuit is taken out as a negative output signal of the amplifier.

4. The amplifier according to claim 3, wherein each of the first and second circuits is a level shift circuit which shifts signal levels.

5. The amplifier according to claim 1 further comprising an input level controller that controls an input level of an input signal to be input to the operation amplifier based on the detection signal.

6. An amplifier comprising:
an operation amplifier including a positive input terminal, a negative input terminal, a positive output terminal and a negative output terminal;
at least one negative feedback circuit disposed in a path extending from one of the output terminals of the operation amplifier to the one of the input terminals of the operation amplifier having the opposite polarity; and
a detector which compares at least one of a voltage of the positive input terminal and a voltage of the negative input terminal of the operation amplifier with a predetermined voltage, detects that the at least one voltage exceeds the predetermined voltage, and outputs a detection signal.

7. The amplifier according to claim 6, wherein the predetermined voltage is set in accordance with a degree of clipping that occurs in an output signal of the amplifier, and the detection signal indicates that clipping at the set degree occurs.

8. The amplifier according to claim 7 further including an input level controller that, based on the detection signal, controls an input level of an input signal to be input to the operation amplifier via at least one of the positive input terminal and the negative input terminal.

9. The amplifier according to claim 6, wherein the at least one negative feedback circuit includes:
a first circuit which is formed in a first path extending from the negative output terminal of the operation amplifier to the positive input terminal of the operation amplifier, and
a second circuit which is formed in a second path extending from the positive output terminal of the operation amplifier to the negative input terminal of the operation amplifier, and wherein an output signal of the first circuit is taken out as a negative output signal of the amplifier and an output signal of the second circuit is taken out as a positive output signal of the amplifier.

10. The amplifier according to claim 9, wherein each of the first and second circuits is a level shift circuit which shifts signal levels.

11. The amplifier according to claim 6, wherein the detector includes a detection level setting circuit for outputting the predetermined voltage.

12. The amplifier according to claim 1, wherein the detector includes an offset-setting-function-equipped comparator that outputs the detection signal when the voltage of the positive input terminal of the operation amplifier is at least a given offset voltage higher than the voltage of the negative input terminal of the operation amplifier.

13. The amplifier according to claim 1, wherein the detector includes an offset-setting-function-equipped comparator that outputs the detection signal when the voltage of the negative input terminal of the operation amplifier is at least a given offset voltage higher than the voltage of the positive input terminal of the operation amplifier.

14. The amplifier according to claim 1, wherein the detector includes:
a first offset-setting-function-equipped comparator that outputs a first true signal when the voltage of the positive input terminal of the operation amplifier is at least a given first offset voltage higher than the voltage of the negative input terminal of the operation amplifier;
a second offset-setting-function-equipped comparator that outputs a second true signal when the voltage of the negative input terminal of the operation amplifier is at least a given second offset voltage higher than the voltage of the positive input terminal of the operation amplifier; and
an OR circuit that outputs the detection signal when either the first true signal or the second true signal is output, and when both the first true signal and the second true signal are output.

15. The amplifier according to claim 14, wherein the first offset voltage and the second offset voltage are equal.

* * * * *